(12) United States Patent
Modderman et al.

(10) Patent No.: US 7,835,017 B2
(45) Date of Patent: Nov. 16, 2010

(54) LITHOGRAPHIC APPARATUS, METHOD OF EXPOSING A SUBSTRATE, METHOD OF MEASUREMENT, DEVICE MANUFACTURING METHOD, AND DEVICE MANUFACTURED THEREBY

(75) Inventors: Theodorus Marinus Modderman, Nuenen (NL); Nicolaas Antonius Allegondus Johannes Van Asten, Breda (NL); Johan Maria Van Boxmeer, Sint Oedenrode (NL); Gerrit Johannes Nijmeijer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 454 days.

(21) Appl. No.: 10/583,985

(22) PCT Filed: Dec. 22, 2004

(86) PCT No.: PCT/NL2004/000900

§ 371 (c)(1),
(2), (4) Date: Jun. 4, 2007

(87) PCT Pub. No.: WO2005/062131

PCT Pub. Date: Jul. 7, 2005

(65) Prior Publication Data

US 2007/0252963 A1 Nov. 1, 2007

(51) Int. Cl.
*G01B 11/28* (2006.01)
(52) U.S. Cl. .................................................. 356/630
(58) Field of Classification Search ......... 356/511–516, 356/600, 601, 609
See application file for complete search history.

(56) References Cited

U.S. PATENT DOCUMENTS

| 2002/0018207 A1 | 2/2002 | Ina et al. |
| 2002/0158185 A1 | 10/2002 | Nelson et al. |
| 2003/0218141 A1 | 11/2003 | Queens et al. |

FOREIGN PATENT DOCUMENTS

EP     1 061 561 A1    12/2000

(Continued)

OTHER PUBLICATIONS

International Search Report issued in International Application No. PCT/NL2004/000900 dated Jan. 4, 2005.

(Continued)

*Primary Examiner*—Tarifur Chowdhury
*Assistant Examiner*—Tara S Pajoohi
(74) *Attorney, Agent, or Firm*—Pillsbury Winthrop Shaw Pittman LLP

(57) ABSTRACT

A method of exposing a substrate (e.g. in a lithographic apparatus comprising a substrate table to support a substrate) according to one embodiment of the invention includes performing first and a second height measurement of a part of at least one substrate with a first and second sensor, generating and storing an offset error map based on a difference between the measurements; generating and storing a height map of portions of the substrate (or another substrate that has had a similar processing as the part) by performing height measurements with the first sensor and correcting this height map by means of the offset error map; and exposing the substrate (or the other substrate).

28 Claims, 2 Drawing Sheets

FOREIGN PATENT DOCUMENTS

| | | |
|---|---|---|
| EP | 1 253 471 A2 | 10/2002 |
| JP | 63-024116 A | 2/1988 |
| JP | 2001-143991 | 5/2001 |
| JP | 2001-345250 A | 12/2001 |
| JP | 2003-031493 A | 1/2003 |

OTHER PUBLICATIONS

Chinese Office Action for Appln. No. 200480041713.7 dated Jun. 13, 2008.

English translation of Japanese Official Action issued on Jun. 18, 2009 in Japanese Application No. 2006-546870.

LITHOGRAPHIC APPARATUS, METHOD OF EXPOSING A SUBSTRATE, METHOD OF MEASUREMENT, DEVICE MANUFACTURING METHOD, AND DEVICE MANUFACTURED THEREBY

CROSS REFERENCE TO RELATED APPLICATIONS

This is the U.S. National Phase of PCT/NL2004/000900, filed Dec. 22, 2004, which in turn claims priority to U.S. patent application Ser. No. 10/740,824, filed Dec. 22, 2003, both of which are incorporated herein in their entirety by reference.

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. No. 5,296,891 and U.S. Pat. No. 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

It may be desirable to take a substrate height map each time a substrate is exposed. If a substrate has already been subjected to one or more process steps, the surface layer will no longer be pure polished silicon and there may also be structures or a topology representing the features already created on the substrate. Different surface layers and structures can affect the level sensor readings and in particular can alter its offset. If the level sensor is optical, these effects may, for example, be due to diffraction effects caused by the surface structure or by wavelength dependence in the surface reflectivity, and cannot always be predicted. If the level sensor is a capacitive sensor, a process dependent error may be caused by the electrical properties of the substrate.

SUMMARY

A method of measurement according to one embodiment of the invention includes using a first sensor to measure at least one height of a first portion of a substrate and using a second sensor to measure at least one height of the first portion of the substrate. The method also includes generating a characterization of an offset error of the first sensor, based on the at least one height measured using the first sensor and the at least one height measured using the second sensor, and using the first sensor to measure a plurality of heights of a second portion of a substrate. A characterization of the second portion of a substrate is generated, based on the plurality of heights of the second portion of a substrate and the characterization of an offset error of the first sensor.

A method of measurement according to a further embodiment of the invention includes using a first sensor to measure at least one height of a first portion of a substrate and using an in resist focus determination to measure at least one height of the first portion of the substrate. The method also includes generating a characterization of an offset error of the first sensor, based on the at least one height measured using the first sensor and the at least one height measured using the in resist focus determination, and using the first sensor to measure a plurality of heights of a second portion of a substrate. A characterization of the second portion of a substrate is generated, based on the plurality of heights of the second portion of a substrate and the characterization of an offset error of the first sensor.

Many variations of such methods, device manufacturing methods, and lithographic apparatus and data storage media that may be used to perform such methods are also disclosed herein.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods of exposing a substrate that may be used to correct process dependent offset errors of a level sensor in an accurate and cost effective way.

Figure 1:
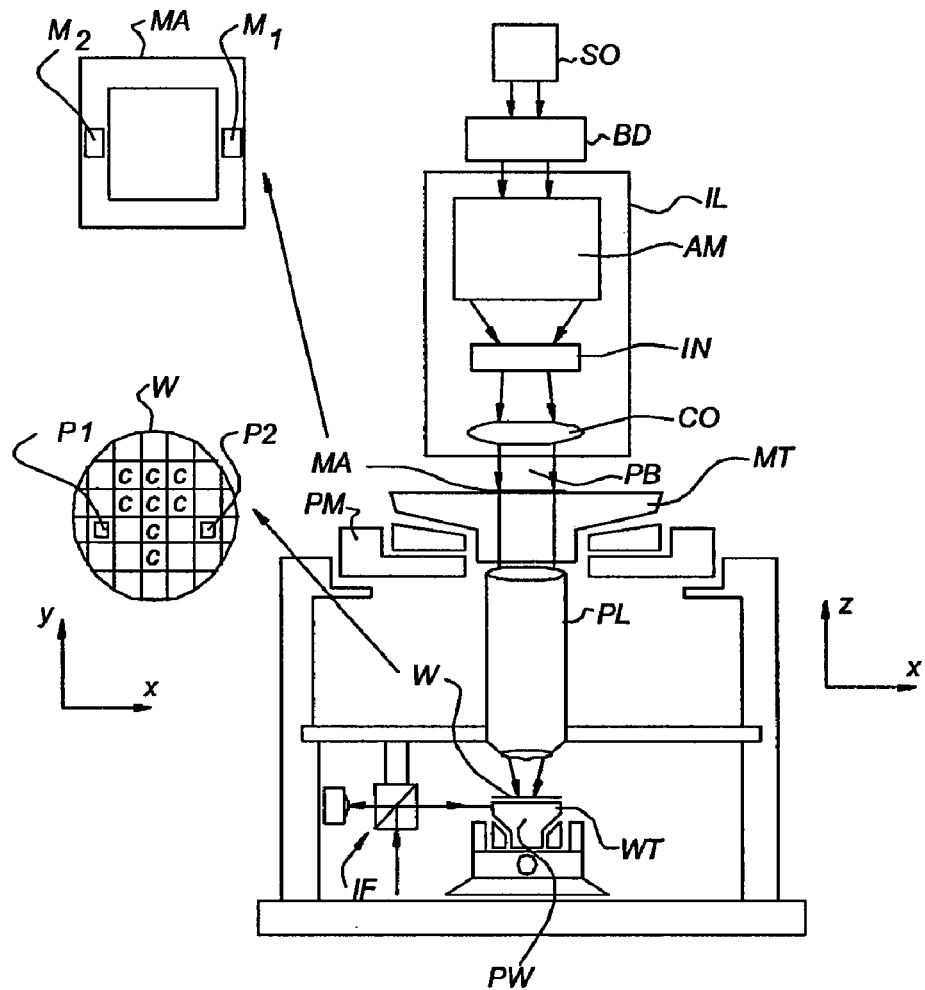
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with resect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, a maximum size of the exposure field may limit the size of the target portion exposed in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and/or direction of the substrate table WT relative to the mask table MT may be determined by magnification, demagnification (reduction), and/or image reversal characteristics of the projection system PL. In this manner, a relatively large target portion C can be exposed, without having to compromise on resolution. In scan mode, a maximum size of the exposure field may limit the width (in the non-scanning direction) of the target portion exposed in a single dynamic exposure, whereas the length of the scanning motion may determine the height (in the scanning direction) of the target portion exposed;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

It will be understood that it may be important for the exact position of the substrate with respect to a patterning structure and/or projection system to be known and/or controlled accurately. For example, it may be important not only for an image of the mask to be projected exactly on the intended target portion without lateral displacement, but also for the image of the mask to be focused as precisely as possible onto the surface of the substrate.

For achieving an optimal focus of a projection beam with respect to a top surface of the substrate (e.g. a layer of resist on the substrate), it may be desirable or necessary for a height between the substrate and the mask and/or optical system to be determined. For example, it may be desirable or necessary to adjust the height to a height corresponding with a desired focus distance. Since the thickness of the substrate may vary, it may be desirable or necessary to determine a desired or optimal positioning of the substrate (e.g. with respect to the mask and/or optical system) for every exposure operation. Also, since a substrate may not be a perfectly flat object, a desired or optimal focus position of the substrate may vary over the surface of the substrate. Finally, substrates may be different and have different morphologies. Therefore it may be desired to measure for each substrate a height map of part or all of the substrate, possibly for every exposure operation.

A lithographic projection apparatus that may be used to implement one solution includes a level sensor that is positioned next to, or is part of, the optical system that projects the patterned beam onto the substrate. According to this solution, a height map of the substrate is measured during exposure. Based on the measured values, the distance (e.g. height) of the substrate with respect to the optical system can be adjusted, for instance by adjusting a height of a substrate table that supports the substrate.

Alternatively, it is possible to measure a height map of a substrate prior to exposure. Machines are now becoming available in which there are at least two independently moveable substrate tables; see, for example, the multi-stage apparatus described in International Patent Applications WO98/28665 and WO98/40791. One operating principle behind such multi-stage apparatus is that, while a first substrate table is at an exposure position underneath a projection system for exposure of a first substrate located on that table, a second substrate table can, for example, run to a loading position, discharge a previously exposed substrate, pick up a new substrate, perform some measurements (for instance, the above-mentioned height map) on the new substrate, and then stand ready to transfer the new substrate to the exposure position underneath the projection system as soon as exposure of the first substrate is completed; such a cycle may then repeat. In applications of some embodiments of the invention as disclosed herein, the number of substrate tables is irrelevant, as such embodiments may be used with just one substrate table, which may or may not be moved between an exposure position and a measurement position, or with more than two substrate tables.

Measurements performed on the substrate at the measurement position may, for example, include a determination of a spatial relationship (e.g. in X and Y directions) between various contemplated exposure areas on the substrate (also called "dies"), reference marks on the substrate, and at least one reference mark (e.g. a fiducial) located on the substrate table outside the area of the substrate. Such information can subsequently be employed at an exposure position to perform a fast and accurate X and Y positioning of the exposure areas with respect to the projection beam; more information regarding such measurements and their use may be found in PCT Patent Publication WO 99/32940, for example. This document also describes a preparation at a measurement position of a height map relating a Z position of the substrate surface at various points to a reference plane of the substrate holder, where Z denotes a direction perpendicular to the substrate surface.

Measuring a height map of a substrate is typically done using a sensor which interacts with the top surface of the substrate. Such a sensor is commonly referred to as a level sensor. The measurement of the height map of the substrate may be subject to process-dependent errors (PDEs), as is also described in European Patent Publication EP1037117A2.

Two types of process-dependent errors are known: offset, and linearity errors or mis-scaling (i.e. gain). The height measured by a level sensor $z_{LS}$ may be expressed to a reasonable degree of accuracy as a function of the real height $z_{real}$: for example, as $z_{LS}=a^*z_{real}+b$, in which a is the gain and b is the offset. Ideally, the gain (a) equals unity (1) and the offset (b) equals zero.

It may be desirable to take a substrate height map each time a substrate is exposed. If a substrate has already been subjected to one or more process operations, the surface layer may no longer be pure polished silicon, and there may also be structures or a topology representing features already created on the substrate. Different surface layers and structures can affect the level sensor readings and in particular can alter its offset. If the level sensor is optical, these effects may, for example, be due to diffraction effects caused by the surface structure or by wavelength dependence in the surface reflectivity, and cannot always be predicted. If the level sensor is a capacitive sensor, a process-dependent error may be caused by the electrical properties of the substrate.

In order to overcome these process-dependent errors, a process-dependent correction needs to be determined. In European Patent Publication EP1037117A2, several methods for counteracting and/or correcting these process-dependent errors are proposed.

For instance, to determine a required process-dependent gain correction, an exposure area or target position may be measured by the level sensor with the substrate table set to several different vertical positions (e.g. spanning a linear or linearized range of the level sensor). The substrate height may be characterized as a physical distance between the substrate surface and a reference plane defined, e.g., by the substrate table. A position of the reference plane in the Z-direction may be measured, e.g., by an interferometer. Such a substrate height $Z_{wafer}$, should not change with the vertical position of the substrate table, and may be obtained by subtracting the measurements of the level sensor and Z-interferometer: $Z_{WAFER}=Z_{LS}-Z_{IF}$. Here, $Z_{LS}$ denotes the measurement by the level sensor of the surface of the substrate and $Z_{IF}$ denotes the measurement by the interferometer of the reference plane. However, it will be understood that another sensor may be used instead of an interferometer, as long as the position of the substrate table is known.

$Z_{WAFER}$ denotes a height of the substrate with respect to a reference plane. Therefore if the determined value of $Z_{WAFER}$ does change with vertical position of the substrate table, this result may indicate that either or both the level sensor or Z-interferometer (or other sensors used) are not linear or not equally scaled. A Z-interferometer may be deemed to be linear, since it may be linear to a greater extent than a required accuracy for the substrate height map. Therefore, any differences in the substrate height values may be assumed to result from linearity errors or mis-scaling of the level sensor, e.g. from a gain error. Such differences, and possibly knowledge regarding the corresponding level sensor readings at which they were observed, can be used to correct an output of the level sensor. In an embodiment of the invention that includes a level sensor or use thereof, a simple gain correction is proposed. However, a more complex correction may be used with other known sensors.

If the substrate to be processed has exposure areas on it that have been subjected to different processes, then a process-dependent correction may be determined for each different type of exposure area on the substrate. Conversely, if a batch of substrates having exposure areas that have undergone the same or similar processes are to be exposed, it may only be necessary to measure the process-dependent correction for each type of exposure area once per batch. Such a correction can then be applied each time that type of exposure area is height-mapped in the batch.

Sensors are known that are not subject to process dependent errors. Such a process-independent sensor may be an air gauge or a scanning needle profiler. An air gauge, as will be known to a person skilled in the art, may determine the height map of a substrate by supplying a gas flow from a gas outlet to the surface of the substrate. Where the surface of the substrate is high, i.e. the surface of the substrate is closer to the gas outlet, the gas flow will relatively experience a high resistance. By measuring the resistance of the flow as a function of the spatial position of the air gauge above the substrate, a height map of the substrate can be obtained that may be independent (or at least relatively so) of at least some of the properties of the substrate (for instance, electrical and/or optical properties of the top layer of the substrate) and therefore may provide a process independent height map.

A scanning needle profiler may be used to scan a height map of a substrate with a needle, which may also provide a height map that is independent of properties such as electrical and/or optical properties of the resist layer. Also other process independent sensors are known. However, such process independent sensors generally have a scanning rate (or bandwidth) that is low in comparison with the process dependent level sensors (e.g. lower by a factor of up to 100). Furthermore, the scanning rate of these process independent sensors may be low in comparison to what is demanded.

Known methods for determining the process dependent error are generally very time consuming, since known process independent sensors are relatively very slow. Determining the process dependent gain error using process dependent sensors according to a method as discussed above may involve measuring from different heights relative to the substrate. Such an arrangement may imply that the substrate table on which the substrate is positioned has to move in height and/or that the sensors have to move in height, which may be time-consuming. Additionally, it is possible that such a method may only help to correct for process dependent gain errors (a) and not for process dependent offset errors (b). One possible distinction between gain correction and offset correction is that a gain correction may be based on a relative measurement (e.g. where the substrate is moved in height by a known amount, and the response of the level sensor is compared to the known movement), whereas an offset correction may be based on an absolute measurement (e.g. with respect to a zero height value).

Other techniques are available that reduce process dependent offset errors. For example, European Patent Publication No. EP1037117A2, referred to above, describes different solutions that may be used to provide adjustments to the sensor used. This patent publication proposes to measure a height using a sensor that uses more than one wavelength. The document also proposes to vary the angle of incidence at which the level sensor measures the height. The measurements obtained from these measurement values (e.g. using several wavelengths and/or varying angles) may be used to counteract a process dependent offset. However, these solutions may be relatively cumbersome (e.g. time-consuming) and therefore relatively expensive. In addition, they may not be able to determine a process dependent offset error.

United States Published Patent Application No. 2002/0158185 provides a solution for process dependent offset error using a first level sensor in combination with an air gauge that has no process dependent error. These sensors both determine the height of the substrate, or part of the substrate, prior to exposure. The difference between these measurements is determined, stored, and used as a measure for a process dependent error (i.e. the offset) of the first level sensor. A second level sensor is used during exposure (on-the-fly) that is essentially the same as the first level sensor. The measurements of this second level sensor are corrected using the stored process dependent error of the first level sensor, assuming that this process dependent error equally applies to the second level sensor. This solution however requires two essentially the same level sensors (i.e. the sensors must have matched performances) which makes it a relatively difficult and expensive solution.

In a method according to an embodiment of the invention, the process dependent offset error is determined using a first sensor 10 and a second sensor 11 that are both used in an absolute measurement (i.e. with respect to a zero height value) to measure a height of the substrate W itself. Thus, in contrast to measurements where a gain error is to be determined and where the height of the substrate W is moved relative to the measurement equipment during the measurements (to obtain a relative measurement of the height movement), in this method the height of the substrate W is not moved relative to the measurement equipment. The difference between the obtained measurements is then used to determine the process dependent offset error (PDOE). Different embodiments of the invention will be discussed further below.

Figure 2:
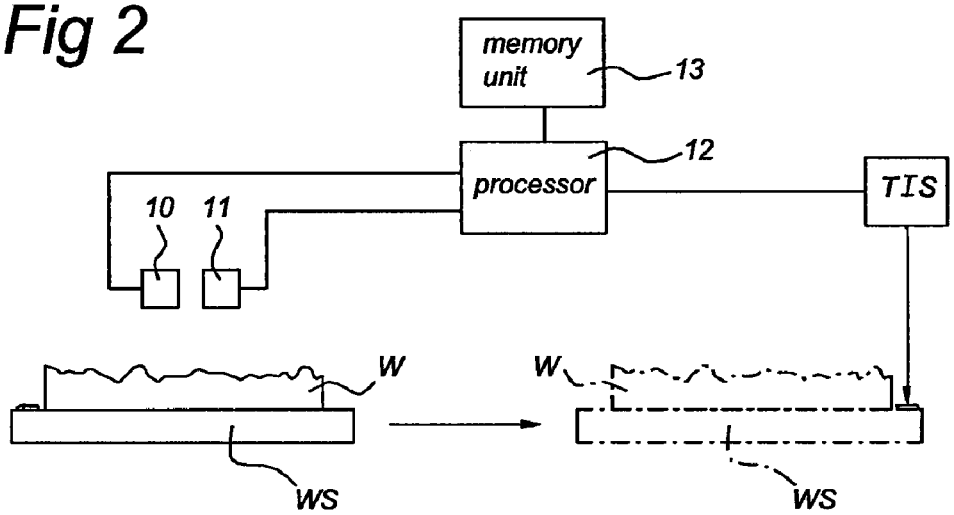
FIG. 2 schematically depicts an arrangement according to an embodiment of the present invention.

FIG. 2 shows substrate W, a first sensor 10, and a second sensor 11 positioned above the substrate W e.g. to determine a height map of the substrate W. FIG. 2 also shows a processor 12 that is arranged to communicate with the first sensor 10 and the second sensor 11. The sensors 10, 11 are arranged to transfer their measurements to the processor 12. The processor 12 is further arranged to communicate with a memory unit 13. The processor 12 can store and retrieve data from the memory unit 13. The processor 12 is further arranged to perform calculations with data retrieved from the first sensor 10, the second sensor 11 and/or the memory 13, as will be discussed below. The processor 12 and/or the memory 13 may be part of the lithographic projection apparatus 1, but may also be placed outside the lithographic projection apparatus 1.

In an apparatus according to one embodiment of the invention, the first sensor 10 is a process independent sensor, such as an air gauge or a scanning needle profiler, of which the height measurements do not depend on the electrical and/or optical properties of the surface measured. The second sensor 11 is a process dependent sensor, i.e. has an offset error that may depend on a process performed on the substrate W (PDOE). It is assumed that gain errors were already corrected beforehand. The difference between the measurement of the first and second sensor is then substantially formed by the process dependent offset error. In such case, it may be assumed that the PDOE is fully caused by the second sensor 11 and that the 'real' height of the substrate W is known from the readings of the first sensor 10.

Measurements may be made using the first and second sensors 10, 11 for a plurality of positions on the substrate, e.g. by scanning the substrate underneath the sensors 10, 11. The measurements obtained by the first and second sensors 10, 11 can be used to construct a map in which the PDOE of the second sensor 11 is stored for each position on the substrate W measured. This map could be a simple table in which, per process step, for combinations of X and Y coordinates that indicate positions on the substrate W, the PDOE is stored. Thus, in other words, the measurements of the second sensor 11 may be calibrated as a function of the X, Y position and the process in which this second sensor 11 is used, and the respective calibration data may be stored in memory unit 13.

A PDOE map of the second sensor 11 that is calculated by processor 12 may be stored in memory unit 13. When further processing of the substrate W takes place, the PDOE map may be retrieved from this memory unit 13. However, the PDOE map may also be transferred to a further memory unit (not shown) from which it might be retrieved more easily and faster by the lithographic projection apparatus 1 during exposure.

Since the PDOE depends on the properties of the substrate W (e.g. the kind of resist used and the composition of the structure underneath the layer of resist), this PDOE can be assumed to be the same for every part of the substrate W that has the same kind of properties, e.g. corresponding target portions C (or parts of target portions) that have been subjected to similar exposure or exposures with similar patterns and similar treatments. These properties may include optical and/or electrical properties of the substrate. In practice, such a dependence could imply that the PDOE map may be the same for every corresponding target portion C on the substrate W and/or for every corresponding target portion C on other substrates W in a corresponding process step.

The determination of the PDOE map may be a time-consuming process e.g. as a result of the use of a process independent sensor (air gauge and scanning needle profiler measurements are slow). However, because the PDOE map may be similar for similar target portions C, it may be sufficient to determine a specific PDOE map one time for each similar target portion C. Once the PDOE map is known for a certain type of target portion C, all substrates W having similar target portions C may be processed normally using fast process dependent sensors. The measurements of these process dependent sensors, which can operate at normal processing rates, can be corrected using the previously constructed PDOE map. Thus, for all similar target portions C, only one PDOE map may need to be constructed.

For lithographic exposure, a height map may be constructed of the substrate W. This construction can be done at the exposure position of the lithographic apparatus or at a remote position of the lithographic apparatus, for instance at a measurement position in a so-called multi-stage machine, as is discussed in more detail in European Patent Publication No. EP1037117A2.

Prior to exposure of the substrate W, a height map of the substrate W may be determined using a level sensor that is subject to the same PDOE as the second sensor 11 used to determine the PDOE map. The second sensor 11 and the level sensor can also be one and the same sensor. The measurements of the level sensor can now be corrected with the use of the PDOE map e.g. by simply adding the content of the PDOE map for that corresponding position on the target portion C to the measurement of the level sensor. For instance, this calculation may be done by processor 12, using data previously stored in memory unit 13. Such a method may make it possible to process substrates W with a relatively high processing rate, since the height map is obtained with a relatively fast level sensor, while process dependent errors are compensated.

In a method according to a further embodiment of the invention, the process dependent offset error map and the height map are determined before exposure. During exposure, the substrate W is positioned with respect to the patterned beam PB by positioning the wafer table WT based on measurements obtained by an image sensor, e.g. fixed to the wafer table, such as a so-called TIS sensor, that will be described below for a multistage machine.

In a multi-stage machine, as depicted in FIG. 2, the surface of the substrate W may be mapped with the level sensor at a measurement position. The map may be measured relative to a reference plane (e.g. as defined by the TIS), which information may be stored in a memory.

The substrate W is then transported to the exposure position, depicted in FIG. 2. Before exposure, the position and orientation of the substrate table WT may be measured by the TIS and related to the reference plane. The TIS measures the position of a plurality of marks imaged from the mask MA onto the substrate table (including the height of the masks). A plurality of TIS sensors is conventionally used (of which only one is shown in FIG. 2).

It may not be necessary to measure the surface of the substrate W at the exposure position, since the data previously obtained by the measurements of the level sensor at the first position may be retrieved from the memory and the height and tilt of the substrate W may be adjusted during exposure based on this information with respect to a reference plane defined e.g. using the TIS.

In such a machine, the measurements of the level sensor at the measurement position may be corrected for the process dependent offset error using the PDOE map. However, it is also possible to instead apply the correction during exposure. A same method could be used for a single stage machine, where e.g. the measurement and exposure position are the same position, and the height map is constructed before exposure.

In the above description, the first and second sensors 10, 11 are in the same location. However, it is possible to measure the surface of the substrate W with the first (process independent) sensor 10 at a first location and with the second sensor 11 at a second location. The first location may even be outside the lithographic projection apparatus 1. For example, the process independent sensor 10 may be a so-called external profiler (e.g. a scanning needle profiler or a scanning tunneling microscope). In this case, it may be important that the measurements of both sensors can be compared with each other. Since the substrate table WT on which the substrate W is positioned may influence the shape of the substrate W, it may be desirable for the substrate W to be positioned in the same position on the same substrate table WT during measurement by the first and the second sensor 10, 11.

As already stated above, the process independent sensor 10 might be an air gauge or a scanning needle profiler, but also other process independent sensors 10 might be used. These process independent sensors are known to a person skilled in the art. For instance, air gauges are discussed in such documents as "The principles and applications of pneumatic gauging" (V. R Burrows, FWP Journal, Oct. 1976) and U.S. Pat. No. 4,953,388.

It will be understood by a person skilled in the art that other embodiments of the invention may be conceived, e.g. as long as the process dependent offset error is determined. Another technique for determining a process dependent offset error map is to image a pattern on the substrate W, process the substrate W, and detect the quality of the patterns obtained (e.g. to determine a local defocus in resist). Based on the detected quality of the different images, the local optimal focus height may be compared with the measurement of the process dependent sensor 11 to determine the process dependent offset error map. Determining local defocus in resist can be done with various techniques which will be described in brief below.

In a method according to a further embodiment of the invention, a first measurement comprises an in resist focus determination method and the sensor 11 is a process dependent sensor. In such a method, the process dependent offset error of the sensor 11 may be determined by a measurement of the resulting defocus on e.g. the same location where a process dependent sensor 11 reading has been done.

To determine a focus offset to be applied to processed substrates W, a common in resist focus determination method used is the Focus Exposure Matrix (FEM). This method is based on exposing critical structures in resist, while varying the focus offset around the estimated best focus in subsequent exposures. These exposures may be placed on the same target portion C of the substrate W or on different target portions C. After development of the resist, inspection or measurement (optical/electrical) of the imaging critical structures may be performed to obtain an optimal focus offset determination for a process layer.

An FEM technique is commonly used to determine optimal focus settings/offsets for the substrate W as a whole, or separate focus offsets per target portion C. Instead of applying such a technique to determine a focus offset per processed substrate W or target portion C, a method according to a further embodiment of the invention includes using such a technique to determine focus variation within a target portion C on the substrate W. It may be desirable to provide a more dense exposure pattern which is matched to the measurement positions in X and Y direction of the process dependent sensor measuring the height of the substrate W. Such an arrangement may allow exposure of imaging critical structures through focus within a certain sensing area of the sensor, and determine the optimal focus setting/focus offset independently for every sensing area of the target portion C (e.g. to determine a PDOE map).

Another known technique to determine focus offsets to be applied to substrates W is using exposures of focus-sensitive marks in resist and using another sensor in the scanner to measure the exposed marks. The marks may be alignment marks, but any other structure being able to be measured with another sensor in the scanner may be used.

These alignment marks are patterned on a mask MA in a dense configuration, and therefore generate a dense pattern of marks on an exposed target portion C. In a method according to a further embodiment of the invention, the marks are made focus sensitive by means of introducing non-telecentricity into the optical projection system. A subset of the alignment marks placed on the mask MA are joined by quartz wedges adhered to the mask MA to introduce non-telecentricity in the projection system (hereinafter called measurement marks). These measurement marks will show a horizontal displacement or shift which is proportional to the defocus with which the mark is exposed. The position of the alignment marks with wedges (measurement marks) may therefore be focus sensitive, while the position of the other marks (called reference marks) may be focus insensitive. The relative shift of the measurement marks with respect to the reference marks may then serve as a measure for the defocus during the test exposure.

The focus offset for a specific location on a processed substrate can be determined by measuring the horizontal shift between exposed marks. Per sensing area, at least one measurement mark and at least one reference mark may be exposed. Such an approach may allow a determination of a focus offset per sensing area on the processed substrate W. These focus offsets may be derived for every sensing area within a specific target portion C and then stored as a process dependent offset error map for every target portion C with identical substrate composition. Such a method to determine the process dependent offset error map for a target portion C may be done by exposing one specific target portion C on a substrate W, or by averaging the focus offsets over all target portions C on the substrate W to determine an average process dependent offset error map, representative of a target portion C.

A similar technique to determine focus offsets to be applied to substrates W is using exposures of focus sensitive marks in resist and using external metrology tooling to measure the exposed marks. The marks may be more specific alignment marks, such as the so-called box-in-box structures, as described in U.S. Pat. No. 5,300,786. The marks themselves may be made focus sensitive by introducing non-telecentricity into the optical projection system. This may be achieved by means of etching phase steps next to the lines on the mask MA which are forming the box-in-box structures and therewith canceling diffraction orders of the imaged structure. Such a method is described in more detail in U.S. Pat. No. 5,300,786.

Per sensing area, at least one mark may be exposed. Such an approach may allow a determination of a focus offset per sensing area on the processed substrate W. These focus offsets may be derived for every sensing area within a specific target portion C and then stored as a process dependent offset error map for every target portion C with identical substrate composition. Such a method to determine the process dependent offset error map for a target portion C may be done by exposing one specific target portion C on a substrate W, or by averaging the focus offsets over all target portions C on the substrate W to determine an average error map, representative of a target portion C.

The measurements of the sensor 11 can now be corrected with the use of the PDOE map, e.g. by simply adding the content of the PDOE map for that corresponding position on the target portion C to the measurement of the sensor 11. For instance, this calculation may be done by processor 12, using data previously stored in memory unit 13. The content of the PDOE map may alternatively be used as a correction during exposure of the substrate W.

If the substrate W to be processed has exposure areas on it that have been subjected to different processes, then a process-dependent offset error map may determined for each different type of exposure area on the substrate. Conversely, if a batch of substrates having exposure areas that have undergone the same or similar processes are to be exposed, it may only be necessary to measure the process-dependent offset error map for each type of exposure area once per batch. That correction can then be applied each time that type of exposure area is height-mapped in the batch.

In a method according to a further embodiment of the invention, the substrate W is measured with a first sensor 10 and a second sensor 11 in order to determine a process dependent offset error (PDOE) map, as is depicted in FIG. 2. In this embodiment, both the first and the second sensors 10, 11 are process dependent sensors, but each has a different sensitivity to process parameters. This result can be achieved in many different ways. For instance, the first sensor 10 may be a process dependent sensor of another type than the second sensor 11. However, the first sensor 10 and the second sensor 11 may also be of the same type, but using different settings such as, for instance, a different wavelength spectrum and/or different polarizations. Finally, the first sensor 10 and the second sensor 11 may also be one and the same sensor using different settings. A difference between the measured values can be used to determine the PDOE map. In this case, the PDOE may not be equal to the difference between the two measured values, but may instead be retrieved by using a model or a table, e.g. that has previously been obtained by experiments, as will be explained below.

Figure 3A:
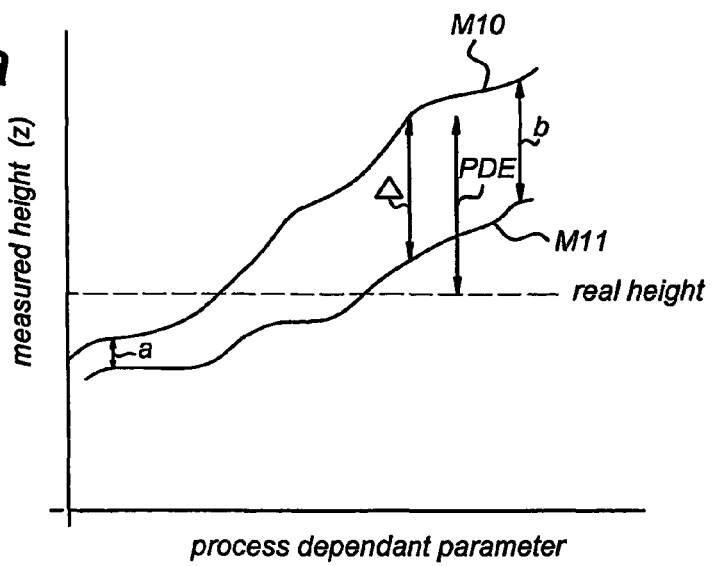
FIGS. 3a and 3b depict graphs from which process dependent errors can be deduced in a method according to an embodiment of the invention.

FIG. 3a depicts a graph of a process dependency of the first sensor 10 and the second sensor 11 (both sensors being process dependent). The horizontal axis shows a process dependent parameter (for instance, the thickness of the resist layer or the refractive index of the resist). Curves M10, M11 show measured height by sensors 10, 11 respectively. The graph of FIG. 3a might be the result of experiments performed in a situation in which the 'real' height as measured by a process independent sensor is kept constant and in which the process dependent parameter of the substrate is varied, height being measured by the first and second sensors 10, 11. However, this graph may also be based on a theoretical model predicting the process dependency of the first and/or second sensors 10, 11.

Note that the FIG. 3a shows which values M1, M11 will be measured at a fixed 'real' height as a function of the process dependent parameter. However, measuring a value with e.g. sensor 10 does not automatically result in knowing the 'real' height (process independent height) and the value of the process dependent parameter, since other combinations of another 'real' height and other value of the process dependent parameter which correspond to the same measured value by sensor 10 could exist.

In the example shown in FIG. 3a, the 'real' height of the substrate W is indicated by the straight horizontal interrupted line. So, this interrupted line represents the measurements that would have been obtained by an ideal, process independent sensor. As can be seen in FIG. 3a, the heights M0, M11 respectively as measured by the sensors 10, 11 respectively vary with respect to this real height as a function of the process dependent parameter.

It may be desirable to obtain a graph as in FIG. 3a for a particular process dependent parameter. The difference between heights M10, M11 is indicated with reference numeral Δ. In such an embodiment, it may be assumed that this difference is a function of the particular process dependent parameter only.

In a method according to a further embodiment, each combination of a measurement value of, e.g. sensor 10 and a difference Δ with the measurement value of sensor 11 has a unique relation with one real height. Per combination of measurement value of sensor 10 and difference Δ, a value of PDOE can therefore be derived. Based on the graph of FIG. 3a, the graph depicted in FIG. 3b can be obtained, showing the PDOE of the first sensor 10 as a function of the difference Δ between the first and second sensors 10, 11. The PDOE of the first sensor 10 can simply be obtained by e.g. computing the difference between the reading of the first sensor 10 with the real height. It may be desirable or important for the graph of PDOE as a function of Δ to be a monotonic function (that may either be increasing or decreasing), e.g. for reasons that will be explained below. Of course, a corresponding graph can also be obtained for the second sensor 11.

Figure 3B:
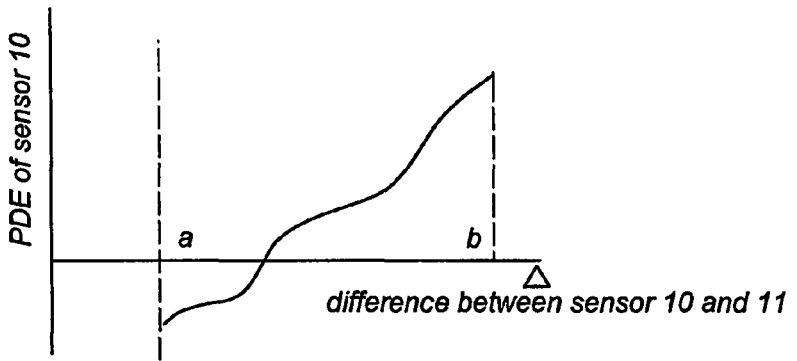

The information from the graph shown in FIG. 3b can be used to obtain a PDOE map of a certain target portion C of the substrate W. Therefore, a target portion C may be measured using the first and second sensors 10, 11 as depicted in FIG. 2. For each position of the target portion C, the difference Δ between the readings of the first and second sensor 10, 11 can be computed. Based on this difference, the PDOE can now be obtained, e.g. by using the graph shown in FIG. 3b.

Once the PDOE map is determined according to the method described, the substrate W can be processed and measured using process dependent sensor 10. The values measured by this sensor 10 can be corrected using the PDOE map, analogously to the first embodiment.

In a method according to a further embodiment of the invention, a difference between the readings of the first sensor 10 and the second sensor 11 as a function of the process dependent parameter is a monotonic upward or downward function. In a method according to another embodiment this is not the case, and it may be difficult or impossible to determine the PDOE unambiguously, unless more knowledge of the process dependent parameter (e.g. resist and oxide thickness ranges, layout, materials used) is known.

The possible values for the difference can be limited to get a monotonic function, or the difference function may be split up in several monotonic parts. For instance, if the graph of FIG. 3b is an oscillating function, a method as described in this embodiment may still be used if additional information is known (for instance, if the height to be determined is known with in a certain range, and the graph is monotonous in that range). This problem can also be reduced by using more than two sensors, as will be discussed below.

It may also be the case that a solution in this embodiment requires that a difference between the readings of the first sensor 10 and the second sensor 11 is not only a unique value for a certain process dependent parameter but a unique value for all process dependent parameters. If the difference Δ cannot only occur for different values of one PD parameter, but also for different PD parameters, additional knowledge of the process as mentioned above may be required to find a unique solution to be able to determine a PDOE map.

In a method according to an embodiment of the invention, the height difference Δ may be assumed to be only dependent on process dependent parameters. However, it is conceivable that the PDOE also depends on the real height. In such a case, such a method could still be applied, e.g. as long as a monotonous relation between the difference of the two sensor readings as a function of the PDOE is maintained. If the height difference Δ also depends on the real height, it may be desirable to measure a graph as shown in FIG. 3a for each height, or to construct such a graph for each height by using a set of measurements done at several heights. Such a graph can then be constructed for other heights by interpolation (such as, for instance, linear interpolation).

One potential advantage of a method according to such an embodiment is the fact that once the necessary graphs according to FIGS. 3a and 3b are determined, the further processing of the substrates W can be done using only process dependent sensors that may be relatively fast or meet special mechanical requirements such as space requirements, contamination requirements, etc.

For methods according to embodiments as discussed above, it will be understood that the PDOE map may only need to be determined once for all corresponding target portions C. All kinds of possible scenarios can be conceived. For instance, a single substrate W may comprise different target portions C that have to be mapped. In case all target portions C are different with respect to each other, it may be desirable to make a PDOE map for the whole substrate W. This PDOE map might only be useful for this single substrate, but in case other substrates have similar target portions C in a similar process step, the map might be used again.

Of course it is also possible to create a PDOE map for every target portion C even if the target portions C are similar. Also a new PDOE map can be created for every substrate W, even if a PDOE map is already known for a similar substrate W. For example, such extra mapping can be done in order to ensure optimal accuracy.

In a multi-stage machine, the obtained PDOE map may be stored in a memory unit 13 and used during the processing of substrate W (for example, in determination of the height map at a first location or during exposure at a second position, as already described above). A PDOE map may be used to correct measurements of a level sensor at the first position in order to determine a height map of each target portion C of a substrate W. The PDOE map may however also be used during exposure at a second position to adjust the height and orientation of the substrate W.

Furthermore, it will be understood by a person skilled in the art, that a similar method may be applied using more than two sensors. For example, it may be possible to determine the PDOE based on differences between measurements done by a number of process dependent sensors having different process dependencies. Also, in a case where the difference between the graphs in FIG. 3a is only a monotonic function of the process dependent parameter over a certain range, more sensors may be used.

Embodiments as described above may be applied to all kinds of lithographic projection apparatus. Such methods may be used in machines using real-time leveling (on-the-fly), or may be used in machines which generate height maps prior to exposure. The latter may include, for instance, a multi-stage apparatus as described in International Patent Applications WO98/28665 and WO98/40791, which are also discussed in the introduction above.

Embodiments of the invention include a method of exposing a substrate in a lithographic apparatus, a device manufacturing method, and a lithographic apparatus comprising an illumination system for providing a projection beam of radiation; a support structure for supporting a patterning structure, the patterning structure serving to impart the projection beam with a pattern in its cross-section; a substrate table for holding a substrate; and a projection system for projecting the patterned beam onto a target portion of the substrate.

A method of exposing a substrate according to one embodiment of the invention, in a lithographic apparatus that includes a support table to support a substrate, includes performing a first height measurement of a part of at least one substrate with a first sensor, the first sensor being a process dependent sensor; performing a second height measurement of the same part of the at least one substrate with a second sensor; generating an offset error map of the first sensor based on a difference between the first and second height measurements and storing this offset error map in a memory unit; generating a height map of portions of the substrate or other substrate that has had a similar processing as the part by performing height measurements with the first sensor and correcting this height map by means of the offset error map; storing this height map in the memory unit; and exposing the substrate or other substrate when supported by the substrate table in an exposing position, the exposing position being controlled by using the wafer table sensor and the height map.

A method of exposing a substrate according to a further embodiment of the invention, in a lithographic apparatus that includes a support table to support a substrate, includes performing a first height measurement of a part of at least one substrate with a first sensor, the first sensor being a process dependent sensor; performing a second height measurement of the same part of the at least one substrate with a second sensor; generating an offset error map of the first sensor based on a difference between the first and second height measurements and storing this offset error map in a memory unit; generating a height map of portions of the substrate or other substrate that has had a similar processing as the part by performing height measurements with the first sensor; storing this height map in said memory unit; and exposing the substrate or other substrate when supported by the substrate table in an exposing position, the exposing position being controlled by using the height map while correcting by means of the offset error map.

A process dependent error map that is constructed for a certain part of the substrate can advantageously be used to correct measurements performed on a similar part of the same or another substrate. The height measured may then easily be corrected with the previously stored process dependent error. Different target portions, or dies, on a substrate are usually exposed to similar patterns and undergo similar treatments in between exposures. So, the process dependent errors of a sensor for a certain target portions may be similar to other target portions.

According to an embodiment, the invention relates to a method where said part is formed by a plurality of subparts on said at least one substrate or where said part is formed by a plurality of subparts on a plurality of substrates.

In a method according to a further embodiment of the invention, the second sensor is a process independent sensor, for instance, at least one of an air gauge, an external profiler, and a scanning needle profiler. In a method according to such an embodiment, the process dependent error of the second sensor may be simply given by a difference between readings of the first and second sensor.

In a method according to a further embodiment of the invention, the first sensor is a process dependent sensor having a first process dependency and the second sensor is process dependent sensor, having a second process dependency, said second process dependency being different from said first process dependency. In a method according to such an embodiment, no expensive and time-consuming process independent sensors may be needed, e.g. with only relatively cost-effective and fast process dependent sensors being used. Such a method may be relatively time-efficient.

A method of exposing a substrate according to a further embodiment of the invention, in a lithographic apparatus that includes a support table to support a substrate, includes performing a first measurement, being a height measurement, of a part of at least one substrate with a first sensor, the first sensor being a process dependent sensor; performing a second measurement of the same part of the at least one substrate comprising an in resist focus determination method; generating an offset error map of the first sensor based on a difference between the first and second measurements and storing this offset error map in a memory unit; generating a height map of portions of the substrate or other substrate that has had a similar processing as the part by performing height measurements with the first sensor and correcting this height map by means of the offset error map; storing this height map in the memory unit; and exposing the substrate or other substrate when supported by the substrate table in an exposing position, the exposing position being controlled by the height map.

A method of exposing a substrate according to a further embodiment of the invention, in a lithographic apparatus that includes a support table to support a substrate, includes performing a first measurement, being a height measurement of a part of at least one substrate with a first sensor, the first sensor being a process dependent sensor; performing a second height measurement of the same part of the at least one substrate comprising an in resist focus determination method; generating an offset error map of the first sensor based on a difference between the first and second measurements and storing this offset error map in a memory unit; generating a height map of portions of the substrate or other substrate that has had a similar processing as the part by performing height measurements with the first sensor; storing this height map in the memory unit; and exposing the substrate or other substrate when supported by the substrate table in an exposing position, the exposing position being controlled by using the height map while correcting by means of the offset error map.

In such a method, the process dependent error of the sensor may be determined by a measurement of defocus on the same location where the process dependent sensor reading has been done (i.e. by performing the measurement and the reading on substantially the same locations). Different sensors and different methods may, for instance, measure the height or defocus of the substrate not at an ideal point, but within a certain sensing area or location. Such sensing means might have different shapes and different sizes for different sensors and methods. The term "same location" should therefore be read to signify "substantially the same location."

In a method of exposing a substrate according to a further embodiment of the invention, the in resist focus determination method uses at least one of a focus exposure matrix (FEM) and focus sensitive marks. Using focus sensitive marks may be based on e.g. an introduction of non-telecentricity into the optical projection system. Methods of executing an in resist focus determination method that may be advantageous are explained in more detail herein.

A device manufacturing method according to an embodiment of the invention may further include providing a substrate; providing a projection beam of radiation using an illumination system; using patterning structure to impart the projection beam with a pattern in its cross-section; and projecting the patterned beam of radiation onto a target portion of the substrate.

A lithographic apparatus according to an embodiment of the invention may include an illumination system for providing a projection beam of radiation; a support structure for supporting patterning structure, the patterning structure serving to impart the projection beam with a pattern in its cross-section; a substrate table for holding a substrate; and a projection system for projecting the patterned beam onto a target portion of the substrate.

Such a lithographic projection apparatus may further include a first sensor arranged for performing a first height measurement of a part of at least one substrate, the first sensor being a process dependent sensor; a second sensor arranged for performing a second height measurement of the same part of the at least one substrate; a processor and a memory unit, said processor being arranged for generating an offset error map of said first sensor based on a difference between the first and second height measurements and storing this offset error map in the memory unit; and where the first sensor is arranged to generate a height map of portions of the substrate or another substrate that has had a similar processing as the part by performing height measurements with the first sensor, and the processor is arranged for correcting this height map by means of the offset error map, and the processor is further arranged for storing this height map in the memory unit, the lithographic apparatus being arranged to expose the substrate or other substrate when supported by a substrate table in an exposing position, the exposing position being controlled by using a wafer table sensor and the height map.

A lithographic apparatus according to a further embodiment of the invention includes an illumination system for providing a projection beam of radiation; a support structure for supporting patterning structure, the patterning structure serving to impart the projection beam with a pattern in its cross-section; a substrate table for holding a substrate; and a projection system for projecting the patterned beam onto a target portion of the substrate. Such a lithographic projection apparatus may further include a first sensor arranged for performing a first height measurement of a part of at least one substrate, the first sensor being a process dependent sensor; a second sensor arranged for performing a second height measurement of the same part of the at least one substrate; a processor, that is arranged to communicate with the first sensor, the second sensor and a memory unit, the processor being arranged for generating an offset error map of the first sensor based on a difference between the first and second height measurements and storing this offset error map in the memory unit; and where the first sensor is arranged to generate a height map of portions of the substrate or another substrate that has had a similar processing as the part by performing height measurements with the first sensor and the processor is arranged to store this height map in the memory unit, the lithographic apparatus being arranged to expose the substrate or other substrate when supported by a substrate table in an exposing position, the exposing position being controlled by using the wafer table sensor and the height map while being corrected by the processor correcting by means of the offset error map.

As already described above, the determination of the PDOE map may be a time-consuming process, e.g. as a result of the use of a process independent sensor (air gauge and scanning needle profiler measurements are slow). However, because the PDOE map may be similar for similar target portions C, it may be sufficient to determine a specific PDOE map one time for each similar target portion C. For all similar target portions C, only one PDOE map may need to be constructed. This technique of using the PDOE map for similar target portions C may be further developed, as will be explained below.

A layer added to the substrate W is usually not entirely flat. When, for instance, a SiO layer is applied and planarized, using chemical mechanical polishing techniques (CMP), the SiO layer may be thicker in the center-region of the substrate W and thinner near the edge of the substrate W. It will be understood that as a result, the process dependent error in the center-region differs from the process dependent error near the edge of the substrate W.

Figure 4:
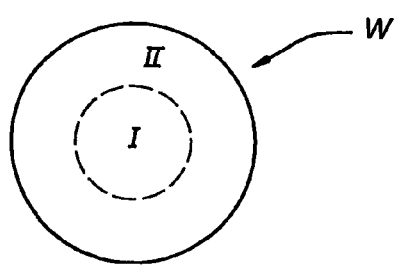
FIG. 4 depicts a substrate as used according to an alternative embodiment of the invention.

As a result of such variations the PDOE map, based on measurements performed in the centre of the substrate W, may not be very accurate near the edge of the substrate W. In order to deal with this problem, the surface of the substrate W may be divided in different areas. The surface of the substrate W may for instance be divided in a first part I and a second part II, where the first part is a circular area at the centre of the substrate W and the second part is the remainder of the substrate W not covered by the first part I, i.e. a ring/annular shaped area along the edge of the substrate W. This is depicted in FIG. 4.

Now, a first PDOE map may be determined for the first part I and a second PDOE map may be determined for the second part II, according to a method as described above. The information of the first and second PDOE map is used when determining height maps of a substrate W using a process dependent sensor, such as sensor 11, as explained above. When a measurement is done with sensor 11 to determine a height map in the first part I of the substrate W, the first PDOE map is used for correcting the height measurement depending on the position where the measurement is performed. When a measurement is done with sensor 11 to determine a height map in the second part II of the substrate W, the second PDOE map is used for correcting the height measurement.

It will be understood that the substrate W may be divided in more than two parts to further increase the accuracy. The parts do not necessarily have to be rotationally symmetric as depicted in the example shown in FIG. 4, but may have any shape.

Figure 5:
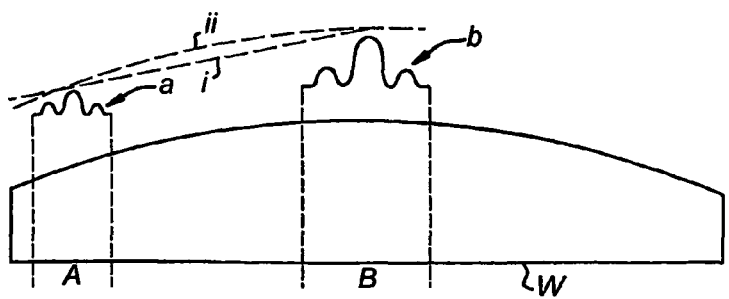
FIG. 5 depicts an exemplary view of a substrate according to a further alternative embodiment of the invention.

According to a further alternative, the method according to the invention is made even more accurate by using an interpolation algorithm. This provides a continuous correction of the process variations over the substrate W. FIG. 5 shows a cross sectional view of a substrate W having a global shape in which the substrate W is thicker at the centre than near the edge. The figure shows that a PDOE map is determined at a first position A (e.g. a target portion) near the edge of the substrate W and a second position B (e.g. an other target portion) at the centre of the substrate W. The PDOE maps of the first and second position A, B are indicated in FIG. 5 with a and b. Now, taking into account the global shape of the substrate, the PDOE map can be determined for the area in between positions A and B by using interpolation techniques.

In case no additional information is available about the global shape of the substrate W, a linear interpolation can be used, as is indicated in FIG. 5 with the dashed line i. If additional information is available about the global shape, this information can be used to use an interpolation technique which is more suitable for the situation. For instance, information might be available indicating that the shape of the substrate is concave or convex in between first and second positions A and B. In the example shown in FIG. 5, in which the substrate W is relatively thick in the centre, a second order polynomial interpolation technique can be used, giving an interpolation curve indicated with the dashed line ii in FIG. 5.

The general idea behind generating and using PDOE maps is that the process dependent errors are the same for target portions C that have been subject to similar processes. However, despite this, differences may occur between different substrates W. Substrates W that originate from different batches (sets of e.g. 25 substrates) may show differences. Also, CMP processing as discussed above, usually done in sets of five substrates W, may cause differences in the process dependency of substrates W between different sets. Therefore it would be necessary to determine a PDOE map for each batch and/or set, which is a rather time-consuming process.

According to a further alternative of the invention, a method is proposed that is more time-efficient. A PDOE map determined for e.g. a first set of substrates W, is updated to be used for a second set of substrates W. This update is done based on a relatively small number of measurements performed on one or more substrates W of a second set. These measurements provide information about the PDOE at certain positions on the substrates W of the second set. These PDOE's of the second set can be compared with corresponding PDOE's of the first set. Based on the difference between the PDOE's of the first and second set, the entire PDOE map of the first set can be corrected to determine a PDOE map that can be used for the second set. This correction may be an offset that is added to the previously determined PDOE map, but may also comprise a gain factor. Thus, only a relatively small number of measurements are done at one or more substrates W of a second set using a first and second sensor 11, 12, as described above.

According to the above a method is described that uses a first and second sensor to measure the height of a substrate W. The first sensor may be used during operation of the exposure tool, and a second and slower sensor is used to calibrate this first sensor. The first sensor may be a relatively fast sensor, but due to the measurement principle (e.g. optical, electrical) is prone to process dependencies in the measurement that depend on the type of substrate W and on the processing applied to the substrate W. The second sensor may be relatively slow, but may be insensitive to all processing induced effects of the substrate's surface to be measured. The measurement of the second sensor is used to determine an offset for the first sensor. Note that the measurement of the first sensor is used in a feed forward at the exposure.

It will be understood that this same principle may not only be used for measuring heights, but also for measuring other characteristics of the substrate W. The same principle may for instance be used for overlay purposes.

For overlay purposes, the position of marks provided on the substrate W are measured in the XY plane, where the x and y axis are substantially in the plane of the surface of the substrate W to be exposed and the z axis is substantially perpendicular to the surface of the substrate W.

During the processing of the substrate W these marks are distorted which leads to an error in measuring the position of the mark. Currently this problem is counteracted by using an optical sensor to measure these marks, which uses a measurement beam comprising two wavelengths. The measurement beam is scanned over the surface the substrate W and when it hits a mark, a diffraction pattern is generated by the mark. The intensity of the diffraction orders is measured by the optical sensor during the scanning. By determining the maximum values of the diffraction orders as a function of the relative position of the substrate W, the position of the marks can be determined. However, this is a relatively time-consuming and expensive solution.

According to the invention, a first and second sensor can be used for overlay purposes, where the second sensor is used to calibrate the first sensor. The second sensor may be a relatively accurate measuring device which can measure the profile of the mark, without measuring its actual position. This second sensor may be a relatively slow sensor. Examples of such a second sensor are a tunneling microscope, a surface profile measuring device or any other suitable sensor. From the determined profile of the mark, the diffraction pattern generated by this mark can be computed.

For instance, in case the left side of a mark is damaged, the maximum intensity of the diffraction orders will be found in a position that is moved to the right with respect to an undamaged mark. Based on this knowledge, an offset can be computed that can be used to correct the measured position of the mark. Thus, an offset can be computed between the measurement of the mark using the first sensor and the measurement using the second sensor and, the computed offset can be used to calibrate the first sensor.

So, the principle of a second sensor that is additional to the first sensor is common for both the overlay and the focus sensor. In both cases the first sensor may be relatively fast and may measure all the marks of all the substrates. The second sensor may be relatively slow, but is capable of measuring an offset that is typical for a whole batch of substrates W processed in the same way. The second sensor only measures one or a few marks of one or a few substrates W of the batch, thus determining an additional offset for the first sensor.

The basic principle lies in the fact that the second sensor uses an other physical method for measuring either the same or an additional physical parameter to which the first sensor is sensitive. The second sensor does not need to measure all marks, and may therefore be a relatively slow sensor. This opens more possibilities for finding such sensors.

Whilst specific embodiments of the invention have been described above, it will be appreciated that the invention as claimed may be practiced otherwise than as described. For example, embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

The invention claimed is:

1. A method of measurement, said method comprising:
using a first, process dependent, sensor to measure at least one height of a first portion of a substrate;
using a second, process independent, sensor to measure at least one height of the first portion of the substrate;
generating a first characterization of an offset error of the first sensor, based on the at least one height measured using the first sensor and the at least one height measured using the second sensor;
using the first sensor to measure a plurality of heights of a second portion of a substrate; and
generating a second characterization of the second portion of a substrate, based on the first characterization and the plurality of heights of the second portion of a substrate.

2. The method of measurement according to claim 1, wherein the first portion and the second portion are portions of the same substrate.

3. The method of measurement according to claim 1, wherein the first portion and the second portion are portions of different substrates.

4. The method of measurement according to claim 1, said method further comprising exposing a substrate based on the second characterization.

5. The method of measurement according to claim 4, said method further comprising, prior to said exposing, storing the second characterization.

6. The method of measurement according to claim 4, wherein said generating a second characterization occurs during said exposing.

7. The method of measurement according to claim 4, wherein said exposing a substrate includes controlling a position of the substrate based on the second characterization.

8. The method of measurement according to claim 4, wherein said exposing a substrate includes projecting a patterned beam of radiation onto a target portion of the substrate to be exposed,
wherein the target portion is at least partially covered by a layer of radiation-sensitive material.

9. The method of measurement according to claim 1, wherein the second characterization includes a height map.

10. The method of measurement according to claim 1, said method further comprising:
using the first sensor to measure a first plurality of heights of portions of different substrates;
using a second sensor to measure a second plurality of heights of the portions of different substrates;
wherein said generating a first characterization is based on the first and second pluralities of heights.

11. The method of measurement according to claim 10, wherein said first portion includes a plurality of subportions of a substrate.

12. The method of measurement according to claim 1, wherein said using a first sensor to measure at least one height of a first portion of a substrate includes measuring a height based on at least one of an optical property of the first portion and an electrical property of the first portion.

13. The method of measurement according to claim 1, wherein said using a second sensor to measure at least one height of a first portion of a substrate includes measuring a height based on a property of the first portion other than an optical property and other than an electrical property.

14. The method of measurement according to claim 1, wherein said using a second sensor to measure at least one height of a first portion includes using at least one of an air gauge, an external profiler, and a scanning needle profiler to measure a height of the first portion.

15. The method of measurement according to claim 1, wherein said using a first sensor to measure at least one height of a first portion of a substrate includes measuring a height based on one of an optical property of the first portion and an electrical property of the first portion, and
wherein said using a second sensor to measure at least one height of a first portion of a substrate includes measuring a height based on the other of an optical property of the first portion and an electrical property of the first portion.

16. The method of measurement according to claim 1, wherein the first characterization and the second characterization are both based on measurements performed within a predetermined part of the surface of the substrate.

17. The method of measurement according to claim 16, wherein a further first characterization and a further second characterization are generated both based on a measurement performed within a predetermined further part of the surface of the substrate.

18. The method of measurement according to claim 1, wherein the first characterization is determined based on a measurement performed on a first portion of a substrate, and a second characterization is determined based on a measurement performed on a second portion of the substrate and further characterizations are determined based on an interpolation of the first and the second characterization.

19. The method of measurement according to claim 1, wherein first characterization of an offset error is determined for a first group of substrates, and a further first characterization is determined for a second group of substrates, based on the first characterization of the offset error for the first group of substrates and measurements performed by the first and second sensors to measure at least one height of a substrate of the second group of substrates.

20. A device manufactured according to the method according to claim 1.

21. A lithographic apparatus comprising:
a first, process dependent, sensor configured to measure at least one height of a first portion of a substrate and to measure a plurality of heights of a second portion of a substrate;
a second, process independent, sensor configured to measure at least one height of the first portion of the substrate;
a processor configured (1) to generate a first characterization of an offset error of the first sensor, based on the at least one height measured using the first sensor and the at least one height measured using the second sensor; and (2) to generate a second characterization of the second portion of a substrate, based on the first characterization and the plurality of heights of the second portion of a substrate.

22. The lithographic apparatus according to claim 21, said apparatus further comprising a patterning structure configured to pattern a beam of radiation according to a desired pattern;
a substrate table configured to hold a substrate;
a projection system configured to project the patterned beam onto a target portion of a substrate held by the substrate table,
wherein the apparatus is configured to position the substrate table based on the second characterization.

23. The lithographic apparatus according to claim 22, said apparatus further comprising a radiation system configured to provide the beam of radiation.

24. The lithographic apparatus according to claim 21, wherein the target portion is at least partially covered by a layer of radiation-sensitive material.

25. The lithographic apparatus according to claim 21, wherein said first sensor is configured to measure a height of the first portion based on at least one of an optical property of the first portion and an electrical property of the first portion.

26. The lithographic apparatus according to claim 21, wherein said second sensor is configured to measure a height of the first portion based on a property of the first portion other than an optical property and other than an electrical property.

27. The lithographic apparatus according to claim 21, said apparatus further comprising a memory unit configured to store at least one of the first and second characterizations.

28. A data storage medium including instructions describing a method of measurement, said method comprising:
using a first, process dependent, sensor to measure at least one height of a first portion of a substrate;
using a second, process independent, sensor to measure at least one height of the first portion of the substrate;
generating a first characterization of an offset error of the first sensor, based on the at least one height measured using the first sensor and the at least one height measured using the second sensor;
using the first sensor to measure a plurality of heights of a second portion of a substrate; and
generating a second characterization of the second portion of a substrate, based on the first characterization and the plurality of heights of the second portion of a substrate.

* * * * *